United States Patent
Reznicek et al.

(10) Patent No.: US 10,734,479 B1
(45) Date of Patent: Aug. 4, 2020

(54) FINFET CMOS WITH ASYMMETRIC GATE THRESHOLD VOLTAGE

(71) Applicant: International Business Machines Corporation, Armonk, NY (US)

(72) Inventors: Alexander Reznicek, Troy, NY (US); Choonghyun Lee, Rensselaer, NY (US); Takashi Ando, Tuckahoe, NY (US); Jingyun Zhang, Albany, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/255,430

(22) Filed: Jan. 23, 2019

(51) Int. Cl.
*H01L 29/10* (2006.01)
*H01L 29/66* (2006.01)
*H01L 21/02* (2006.01)
*H01L 29/167* (2006.01)
*H01L 29/165* (2006.01)
*H01L 29/78* (2006.01)

(52) U.S. Cl.
CPC .... *H01L 29/1054* (2013.01); *H01L 21/02532* (2013.01); *H01L 29/165* (2013.01); *H01L 29/167* (2013.01); *H01L 29/6656* (2013.01); *H01L 29/66545* (2013.01); *H01L 29/66795* (2013.01); *H01L 29/7851* (2013.01)

(58) Field of Classification Search
CPC ......... H01L 29/1054; H01L 29/66795–66818; H01L 29/785–7856; H01L 2029/7857–7858
See application file for complete search history.

(56) References Cited

U.S. PATENT DOCUMENTS

| | | | |
|---|---|---|---|
| 7,645,650 B2 | 1/2010 | Bryant et al. | |
| 7,944,003 B2 | 5/2011 | Ban et al. | |
| 9,640,660 B2 | 5/2017 | Yin et al. | |
| 2015/0162435 A1 | 6/2015 | Sahu et al. | |
| 2016/0118463 A1* | 4/2016 | Cheng | H01L 21/31111 257/192 |

FOREIGN PATENT DOCUMENTS

WO 2018111226 A1 6/2018

OTHER PUBLICATIONS

Baek, K.-J., et al., "Device Optimization of N-Channel MOSFETs with Lateral Asymmetric Channel Doping Profiles", Trans. Electr. Electron. Mater., Feb. 25, 2010, pp. 15-19, vol. 11, No. 1.
Narasimhulu, K., et al., "Impact of lateral asymmetric channel doping on deep submicrometer mixed-signal device and circuit performance", IEEE Transactions on Electron Devices, Dec. 2003, pp. 2481-2489, vol. 50, No. 12.

* cited by examiner

*Primary Examiner* — Daniel P Shook
(74) *Attorney, Agent, or Firm* — Scully, Scott, Murphy & Presser, P.C.; L. Jeffrey Kelly, Esq.

(57) ABSTRACT

A FinFET having an asymmetric threshold voltage distribution is provided by modifying a portion of the channel region of a semiconductor fin that is nearest to the drain side with an epitaxial semiconductor material layer. In some embodiments, the channel region of the semiconductor fin nearest to the drain side is trimmed prior to forming the epitaxial semiconductor material layer.

20 Claims, 8 Drawing Sheets

FINFET CMOS WITH ASYMMETRIC GATE THRESHOLD VOLTAGE

BACKGROUND

The present application relates to a semiconductor structure and a method of forming the same. More particularly, the present application relates to a FinFET having an asymmetric threshold voltage distribution which is provided by partially modifying the channel material that is nearest to the drain side using an epitaxial growth process.

The lateral asymmetric channel (LAC) doping profile approach provides one of the most effective ways to improve the electrical characteristics of field effect transistors (FETs). For LAC devices, the doping concentration of the source side is higher than that of the drain side in the channel region. The channel potential transition at the source side channel region is much stepper than that of the other channel regions, while the device is operating due to non-uniform channel doping. Such a steep potential distribution near the source side enhances the lateral channel electric field and this increases the carrier mobility.

The LAC doping approach, however, suffers from channel dopant diffusion and dopant variation. Also, it is difficult to design short channel devices using the LAC doping approach. As such, there is a need for providing a semiconductor structure having an asymmetric threshold voltage distribution that is formed without using the LAC doping approach.

SUMMARY

A FinFET having an asymmetric threshold voltage distribution is provided by modifying a portion of the channel region of a semiconductor fin that is nearest to the drain side with an epitaxial semiconductor material layer. In some embodiments, the channel region of the semiconductor fin nearest to the drain side is trimmed prior to forming the epitaxial semiconductor material layer.

In one aspect of the present application, a semiconductor structure having an asymmetric threshold voltage is provided. In one embodiment, the semiconductor structure includes a functional gate structure located on a channel region of a semiconductor fin. The structure further includes a source structure located on the semiconductor fin and present in a source side of the functional gate structure, and a drain structure located on the semiconductor fin and present in a drain side of the functional gate structure. The structure even further includes an epitaxial semiconductor material layer present beneath the functional gate structure and located on a portion of the channel region that is nearest to the drain side of the functional gate structure.

In another aspect of the present application, a method of forming a semiconductor structure having an asymmetric threshold voltage is provided. In one embodiment, the method includes forming a structure including a sacrificial gate structure on a surface of a semiconductor fin, wherein an inner spacer and an outer spacer laterally surround the sacrificial gate structure, and wherein a source structure is present on the semiconductor fin and in a source side of the sacrificial gate structure and a drain structure is present on the semiconductor fin and in a drain side of the sacrificial gate structure. The inner spacer nearest to the drain side and the sacrificial gate structure are then removed to physically expose a portion of the semiconductor fin. An epitaxial semiconductor material layer is then formed on the physically exposed portion of the semiconductor fin. Next, the inner spacer nearest to the source side is removed to provide a gate cavity located above a channel region of the semiconductor fin and between the outer spacers, wherein the channel region nearest to the drain side contains the epitaxial semiconductor material layer. A functional gate structure is then formed in the gate cavity and above the channel region of the semiconductor fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
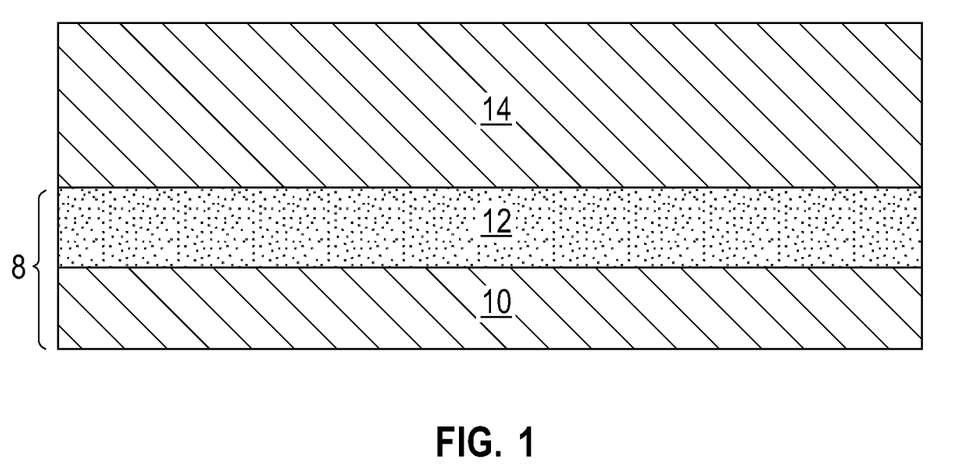
FIG. 1 is a cross sectional view of an exemplary semiconductor structure including a semiconductor fin located on a surface of a substrate.

Referring first to FIG. 1, there is illustrated an exemplary semiconductor structure including a semiconductor fin 14 located on a surface of a substrate 8. Although the present application describes and illustrates a single semiconductor fin 14, the present application can be used in embodiments in which more than one semiconductor fin is formed. In such an embodiment, each semiconductor fin is orientated parallel to each other.

In some embodiments of the present application (and as is shown), the semiconductor fin 14 is formed upon a substrate 8 that includes an insulator layer 12 and a handle substrate 10. In some embodiments, the handle substrate 10 may include a semiconductor material. The term "semiconductor material" denotes a material that has semiconducting properties. Examples of semiconductor materials include, for example, silicon (Si), a silicon germanium (SiGe) alloy, a silicon germanium carbide (SiGeC) alloy, germanium (Ge), a III/V compound semiconductor, or a II/VI compound semiconductor. In other embodiments, the handle substrate 10 may be omitted, or the handle substrate 10 may be composed of a conductive material and/or an insulator material. The insulator layer 12 may include a crystalline or non-crystalline dielectric material. In one example, the insulator layer 12 may be composed of silicon dioxide and/or boron nitride.

In some embodiments (not shown), the semiconductor fin 14 is formed upon a substrate 8 that includes a remaining portion of a bulk semiconductor substrate. The term "bulk semiconductor substrate" denotes a substrate that is composed entirely of one or more semiconductor materials, as defined above. In one example, the bulk semiconductor substrate and thus substrate 8 is composed entirely of Si.

The semiconductor structure shown in FIG. 1 can be formed by first providing a base substrate that includes an upper semiconductor material layer. The base substrate may include a bulk semiconductor substrate or a semiconductor-on-insulator (SOI) substrate. The SOI substrate would include the handle substrate 10, the insulator layer 12, and a topmost semiconductor material which will be subsequently patterned into a semiconductor fin 14. The upper semiconductor material layer of the base substrate is then patterned to provide at least one semiconductor fin 14 that is present on a non-patterned portion of the base substrate (i.e., substrate 8). In some embodiments, a hard mask can be present atop the upper semiconductor material layer of the base substrate prior to patterning and can be removed after patterning of the upper semiconductor material layer.

In one embodiment, the patterning of the upper semiconductor material layer of the base substrate may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. After pattern transfer, the patterned photoresist may be removed utilizing a conventional photoresist stripping process such as, for example, ashing.

In another embodiment, the patterning of the upper semiconductor material layer of the base substrate may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material layer. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the upper semiconductor material layer of the base substrate may include a direct self-assembly (DSA) process in which a copolymer that is capable of direct self-assembly is used.

After patterning of the upper semiconductor material layer of the base substrate, at least one semiconductor fin 14 is formed on a non-patterned portion of the base substrate (i.e., substrate 8). In embodiments in which a bulk semiconductor substrate is employed, substrate 8 and the semiconductor fin 14 may be composed of a same semiconductor material, i.e., silicon. Also, and in embodiments in which a bulk semiconductor substrate is employed, substrate 8 and the semiconductor fin 14 may be composed of different semiconductor materials.

As used herein, a "semiconductor fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor fin 14 has a height from 20 nm to 200 nm, a width from 5 nm to 30 nm, and a length from 20 nm to 200 nm. Other heights and/or widths and/or lengths that are lesser than, or greater than, the ranges mentioned herein can also be used in the present application. When a plurality of semiconductor fins are present on substrate 8, each semiconductor fin is spaced apart from its nearest neighboring semiconductor fin by a pitch of from 20 nm to 100 nm; the pitch is measured from one point of one semiconductor fin to the exact point on a neighboring semiconductor fin.

Figure 2:
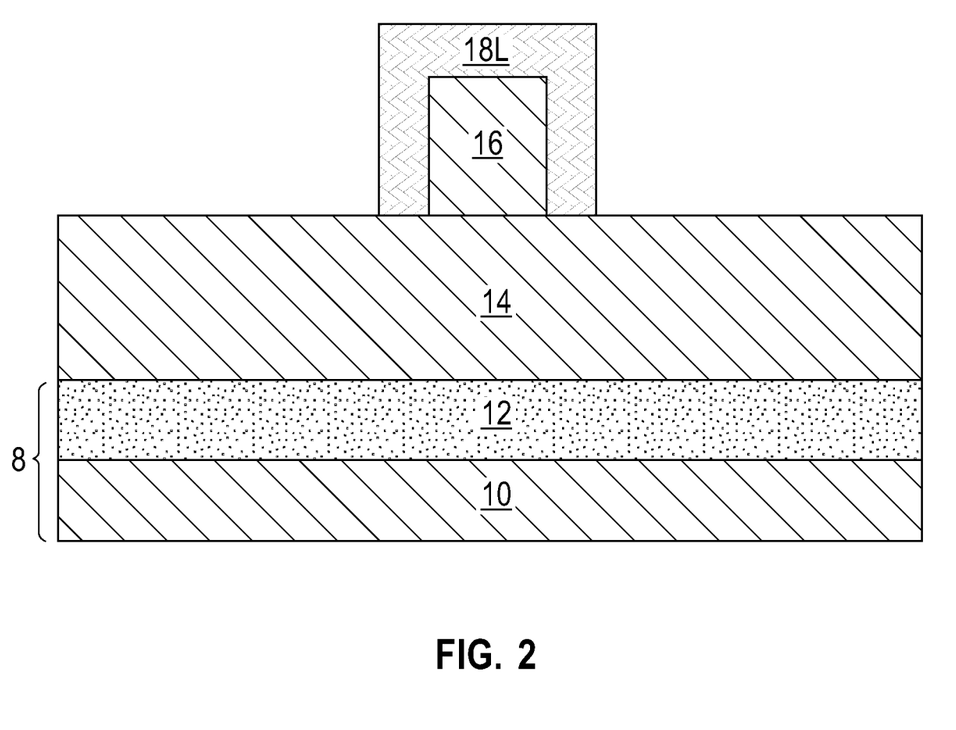
FIG. 2 is a cross sectional view of the exemplary semiconductor structure of FIG. 1 after forming a sacrificial gate structure and a first spacer layer on a surface of the semiconductor fin.

Referring now to FIG. 2, there is illustrated the exemplary semiconductor structure of FIG. 1 after forming a sacrificial gate structure 16 and a first spacer layer 18L on a surface of the semiconductor fin 14. The sacrificial gate structure 16 and the first spacer layer 18L are located on a first side and a second side of the fin structure 14, and span across a topmost surface of a portion of the semiconductor fin 14. The sacrificial gate structure 16 and the first spacer layer 18L thus straddle the semiconductor fin 14.

The sacrificial gate structure 16 may include a single sacrificial material or a stack of two or more sacrificial materials (i.e., the sacrificial gate structure 16 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 16.

The first spacer layer 18L is composed of a first dielectric spacer material. One example of a first dielectric spacer material that may be employed in the present application is silicon nitride. The first spacer layer 18L may be formed by deposition of a first dielectric spacer material, followed by a spacer etch. The deposition of the first dielectric spacer material includes, for example, chemical vapor deposition (CVD), plasma enhanced chemical vapor deposition (PECVD), or physical vapor deposition (PVD). The spacer etch may include a reactive ion etch.

Figure 3:
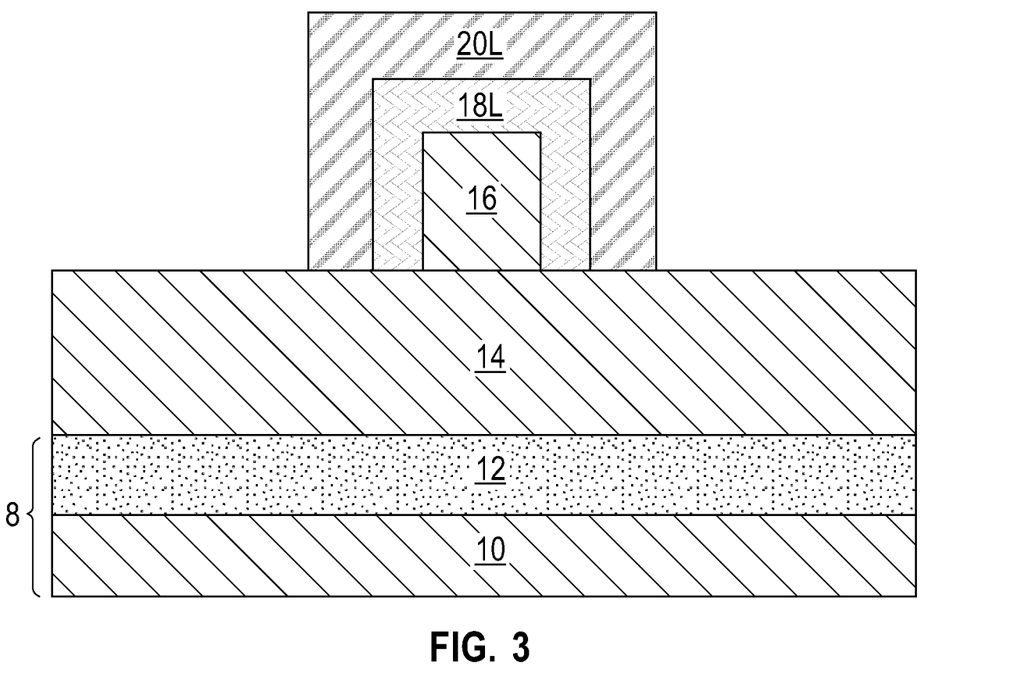
FIG. 3 is a cross sectional view of the exemplary semiconductor structure of FIG. 2 after forming a second spacer layer on the first spacer layer.

Referring now to FIG. 3, there is illustrated the exemplary semiconductor structure of FIG. 2 after forming a second spacer layer 20L on the first spacer layer 18L. The second spacer layer 20L is composed of a second dielectric spacer material that is compositionally different from the first dielectric spacer material. One example of a second dielectric spacer material that may be employed in the present application is silicon dioxide. The second spacer layer 20L may be formed by deposition of the second dielectric spacer material, followed by a spacer etch. The deposition process that can be employed in providing the second dielectric spacer material includes, for example, chemical vapor deposition (CVD), plasma enhanced chemical vapor deposition (PECVD), or physical vapor deposition (PVD). The spacer etch can include a reactive ion etch. The second spacer layer 20L has a lateral width that is greater than a laterally width of the first spacer layer 18L.

Figure 4:
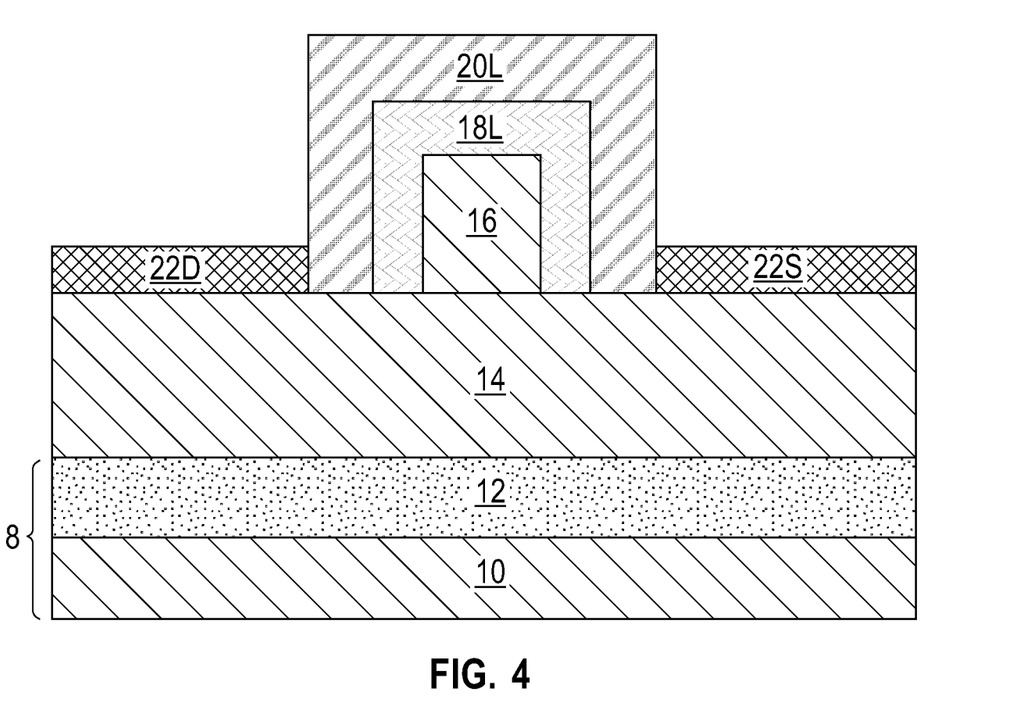
FIG. 4 is a cross sectional view of the exemplary semiconductor structure of FIG. 3 after forming a source structure on one side (i.e., the source side) of the sacrificial gate structure and a drain structure on another side (i.e., the drain side) of the sacrificial gate structure.

Referring now to FIG. 4, there is illustrated the exemplary semiconductor structure of FIG. 3 after forming a source structure 22S on one side (i.e., the source side) of the sacrificial gate structure 16 and a drain structure 22D on another side (i.e., the drain side) of the sacrificial gate structure 16. The source structure 22S will serve as a source region of the resultant FinFET, while the drain structure 22D will serve as a drain region of the resultant FinFET.

Each of the source structure 22S and the drain structure 22D is composed of a semiconductor material and a dopant. The semiconductor material that provides the source structure 22S and the drain structure 22D can be selected from one of the semiconductor materials mentioned above for the handle substrate 10. In some embodiments of the present application, the semiconductor material that provides the source structure 22S and the drain structure 22D may be composed of silicon.

The dopant that is present in the source structure 22S and the drain structure 22D can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source structure 22S and the drain structure 22D may have a dopant concentration of from $4 \times 10^{20}$ atoms/cm$^3$ to $3 \times 10^{21}$ atoms/cm$^3$. In one embodiment, the source structure 22S and the drain structure 22D are composed of phosphorous doped silicon.

In one embodiment, the dopant that can be present in the source structure 22S and the drain structure 22D can be introduced into the precursor gas that provides the source structure 22S and the drain structure 22D. In another embodiment, the dopant can be introduced into an intrinsic semiconductor layer by utilizing one of ion implantation or gas phase doping.

The source structure 22S and the drain structure 22D are formed by utilizing an epitaxial growth process. The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Therefore, an epitaxial material has the same crystalline characteristics as the growth on surface on which it is formed. In the present application, the source structure 22S and the drain structure 22D have a same crystalline characteristic as the semiconductor fin 14.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the source structure 22S and the drain structure 22D can be performed utilizing any well known precursor gas or gas mixture. Carrier gases like hydrogen, nitrogen, helium and argon can be used.

Figure 5:
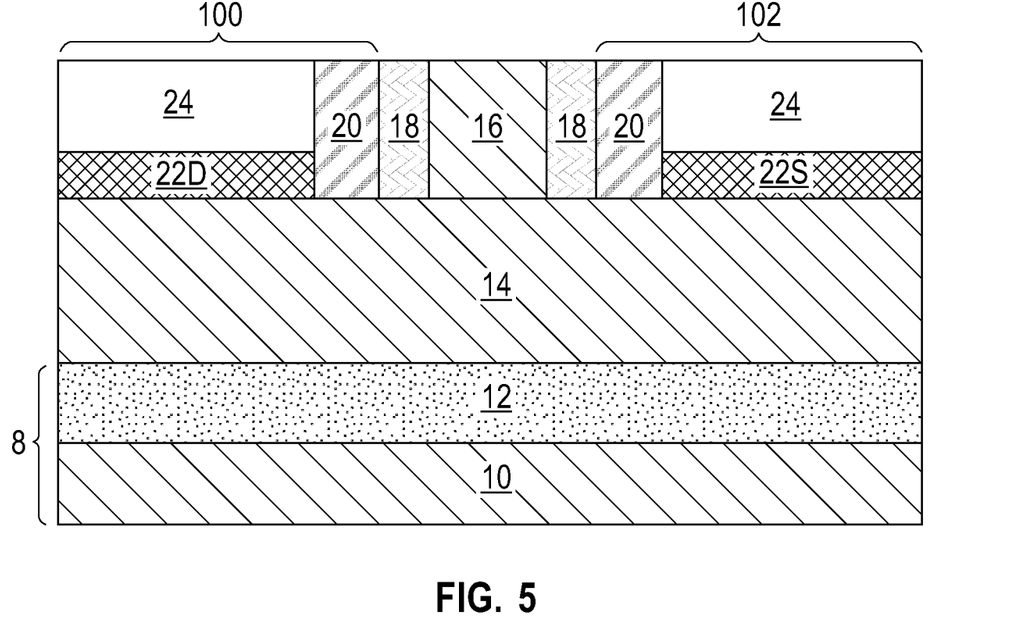
FIG. 5 is a cross sectional view of the exemplary semiconductor structure of FIG. 4 after forming an interlayer dielectric (ILD) material, and performing a planarization process to remove the ILD material, and the first and second gate layers that are located above the sacrificial gate structure and to provide an ILD layer, and first and second spacers.

Referring now to FIG. 5, there is illustrated the exemplary semiconductor structure of FIG. 4 after forming an interlayer dielectric (ILD) material (not specifically shown), and performing a planarization process to removing the ILD material, and the first and second spacer layers (18L, 20L) that are located above the sacrificial gate structure 16 and to provide an ILD layer 24, and first and second spacers (18, 20). Each first spacer 18 may be referred to herein as an inner spacer, while each second spacer 20 may be referred to herein as an outer spacer.

The ILD material is composed of a dielectric material that is compositionally different from the dielectric material of either the first and second spacer layers (18L, 20L). Examples of ILD materials that can be used in the present application include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

In one embodiment, the ILD material can be formed by a deposition process such as, for example, chemical vapor deposition (CVD), plasma enhanced chemical vapor deposition (PECVD), evaporation or spin-on coating. Following the deposition of the ILD material, a planarization process such as, for example, chemical mechanical polishing (CMP) and/or grinding, is employed. The planarization process removes the ILD material, and the first and second gate layers (18L, 20L) that are located above the sacrificial gate structure 16. After planarization, an ILD layer 24 is provided, as well as first and second spacers (18, 20). The ILD layer 24 represents a portion of the ILD material that remains after planarization. Each first spacer 18 represents a portion of the first spacer layer 18L that remains after planarization, while each second spacer 20 represents a portion of the second spacer layer 20L that remains after planarization. A first spacer 18 and a second spacer 20 are present on each side (i.e., the drain side 100 and the source side 102) of the sacrificial gate structure 16. As is shown, the ILD layer 24 has a topmost surface that is coplanar with a topmost surface of the sacrificial gate structure 16, the first spacers 18, and the second spacers 20.

Figure 6:
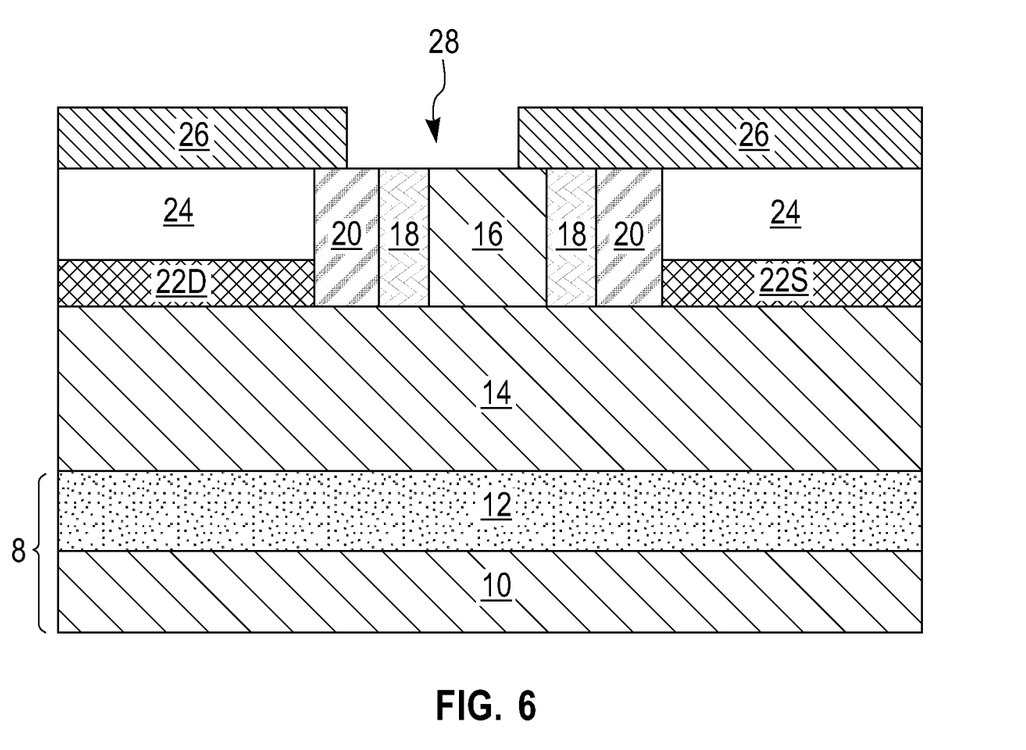
FIG. 6 is a cross sectional view of the exemplary semiconductor structure of FIG. 5 after forming a mask having an opening, the opening partially exposes the sacrificial gate structure, entirety exposes the first spacer that is present nearest to the drain side, and partially exposes the second spacer layer that is present on the drain side.

Referring now to FIG. 6, there is illustrated the exemplary semiconductor structure of FIG. 5 after forming a mask 26 having an opening 28, the opening 28 partially exposes the sacrificial gate structure 16, entirety exposes the first spacer 18 that is nearest to the drain side 100, and partially exposes the second spacer layer 20 that is present on the drain side 100. In some embodiments, the opening 28 may fully expose the sacrificial gate structure 16.

Mask 26 is composed of a masking material that is compositionally different from the ILD layer 24, the first spacer 18 and the second spacer 20. In one embodiment, the mask 26 is composed of silicon dioxide, silicon nitride, or silicon oxide nitride. The mask 26 may be formed by deposition of a masking material and then patterning the masking material by lithography and etching. Mask 26 may have a thickness from 10 nm to 50 nm, although other thicknesses are possible and can be used in the present application as the thickness of mask 26.

Figure 7A:
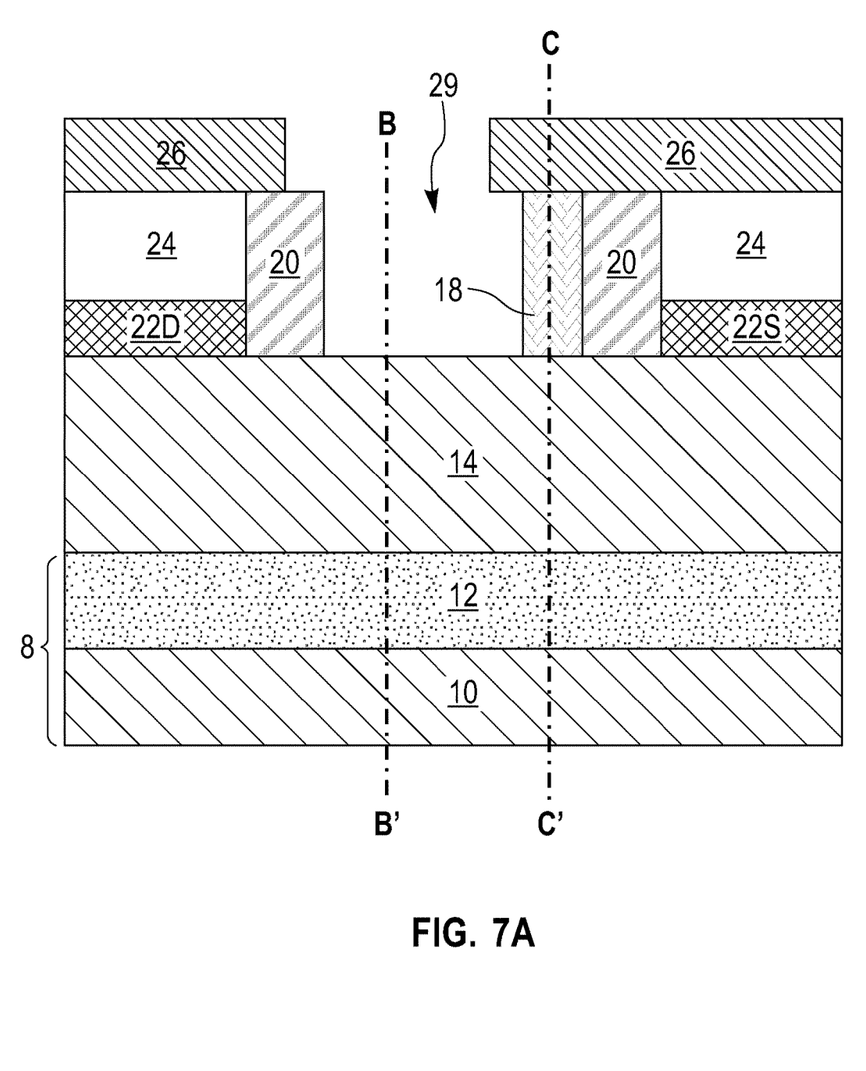
FIG. 7A is a cross sectional view of the exemplary semiconductor structure of FIG. 6 after removing the sacrificial gate structure and the first spacer that is present nearest to the drain side.
Figure 7B:
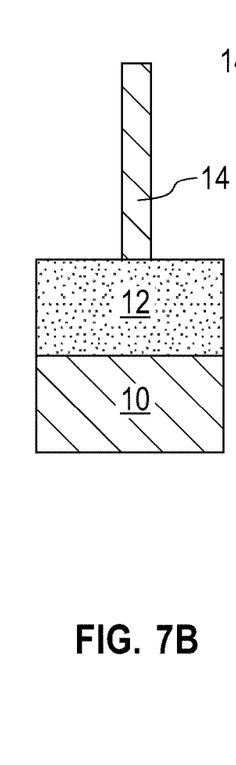
FIG. 7B is a cross sectional view of the exemplary semiconductor structure of FIG. 7A through line B-B'.
Figure 7C:
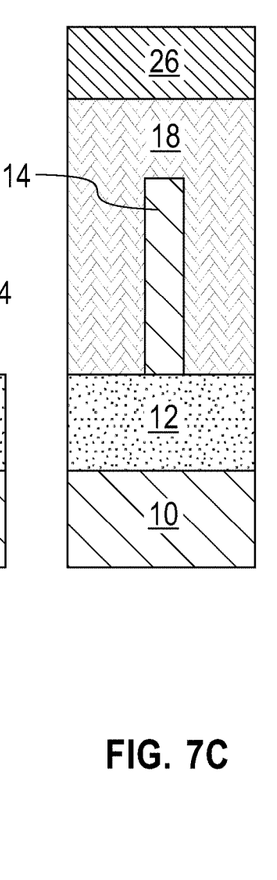
FIG. 7C is a cross sectional view of the exemplary semiconductor structure of FIG. 7A through line C-C'.

Referring now to FIGS. 7A, 7B and 7C, there are shown the exemplary semiconductor structure of FIG. 6 after removing the sacrificial gate structure 16 and the first spacer 18 that is nearest to the drain side 100. The removal of the sacrificial gate structure 16 and the first spacer 18 that is present nearest to the drain side 100 may be performed in any order. In one embodiment, the first spacer 18 nearest to the drain side 100 is removed prior to removing the sacrificial gate structure 16. In another embodiment, the sacrificial gate structure 16 is removed prior to the removal of the first spacer 18 nearest to the drain side 100.

The removal of the first spacer 18 is performed utilizing an etching process that is selective for removing the first spacer 18 relative to the ILD layer 24, the second spacer 20 and, if present the sacrificial gate structure 16. The removal of the sacrificial gate structure 16 is performed utilizing an etching process that is selective for removing the sacrificial gate structure 16 relative to, the ILD layer 24, if present the first spacer 18, and the second spacer 20. A cavity 29 is formed after the removal of the sacrificial gate structure 16 and the first spacer 18 nearest to the drain side 100 of the structure. Cavity 29 physically exposes a portion of the semiconductor fin 14 nearest to the drain side 100. The physically exposed portion of the semiconductor fin 14 nearest to the drain side 100 forms a portion of the channel region of the FinFET structure of the present application.

Figure 8A:
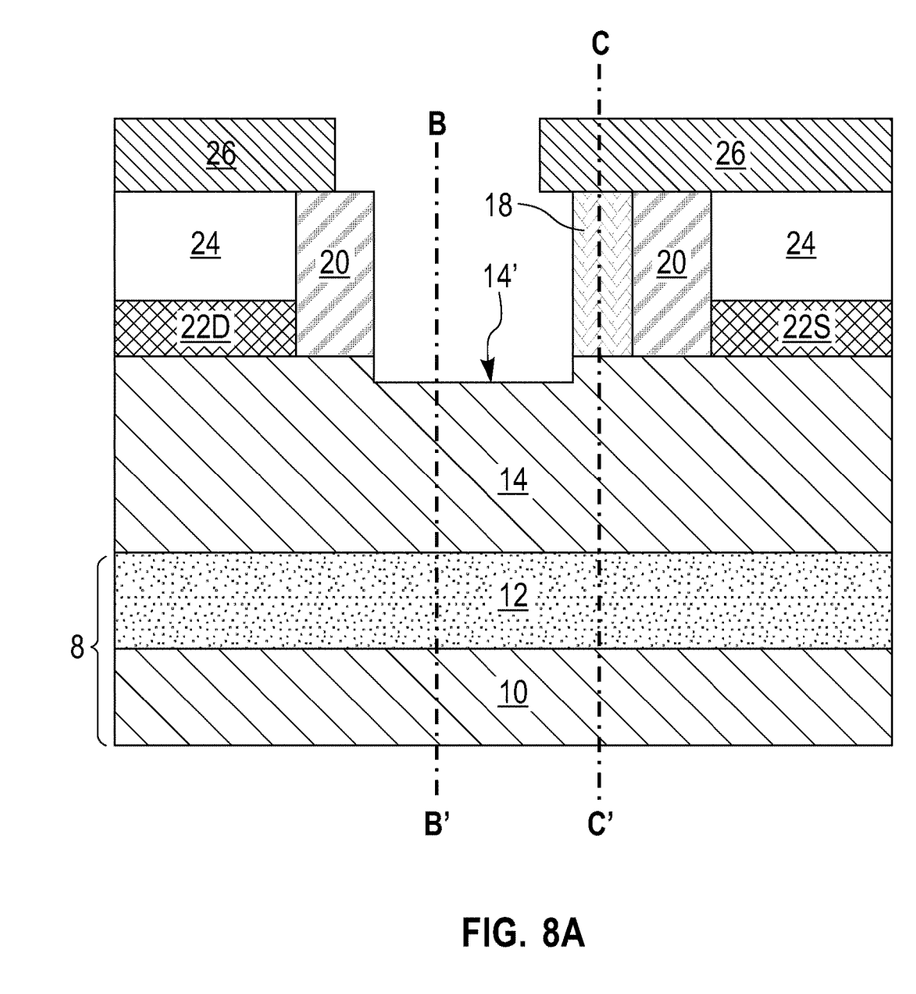
FIG. 8A is a cross sectional view of the exemplary semiconductor structure of FIGS. 7A, 7B and 7C after trimming a physically exposed portion of the semiconductor fin in accordance with an embodiment of the present application.
Figure 8B:
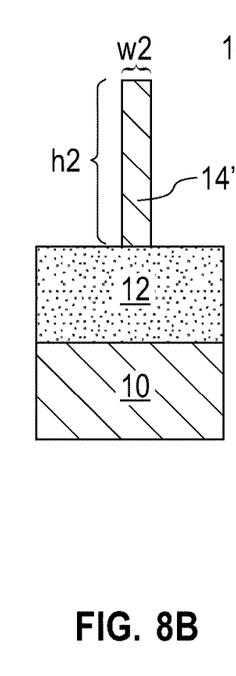
FIG. 8B is a cross sectional view of the exemplary semiconductor structure of FIG. 8A through line B-B'.
Figure 8C:
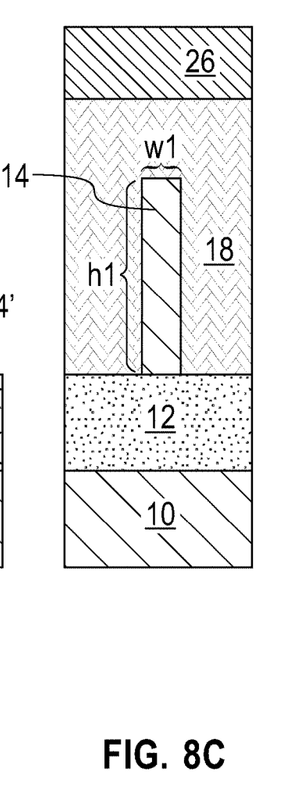
FIG. 8C is a cross sectional view of the exemplary semiconductor structure of FIG. 8A through line C-C'.

Referring now to FIGS. 8A, 8B and 8C there are shown the exemplary semiconductor structure of FIGS. 7A, 7B and 7C after trimming a physically exposed portion of the semiconductor fin 14 in accordance with an embodiment of the present application. Trimming is desirable in some embodiments to maintain the geometry of the resultant FinFET structure. In some embodiments, this trimming step can be omitted. In FIGS. 8A and 8B, element 14' denotes a trimmed semiconductor fin portion.

When employed, trimming can be performed utilizing an well known semiconductor fin trimming process. In one embodiment, trimming can be performed utilizing a wet chemical etching process. In one example, and when the semiconductor fin 14 is composed of silicon, HCl can be used as the wet chemical etchant to trim the physically exposed portions of the semiconductor fin 14. In another embodiment, oxidation (wet or dry) and wet chemical etching may be performed. The oxidation and etching may be repeated any number of times to provide a trimmed semiconductor fin portion 14 having a desired height and width. In one embodiment, trimming is performed to remove from 1 nm to 1.5 nm of the semiconductor fin material from the top and each side of the physically exposed portion of the semiconductor fin.

The trimmed semiconductor fin portion 14' has a second height, h2, that is less than a first height, h1, of the non-trimmed semiconductor fin 14. The trimmed semiconductor fin portion 14' has a second width, w2, that is less than the first width, w1, of the non-trimmed semiconductor fin 14.

Figure 9A:
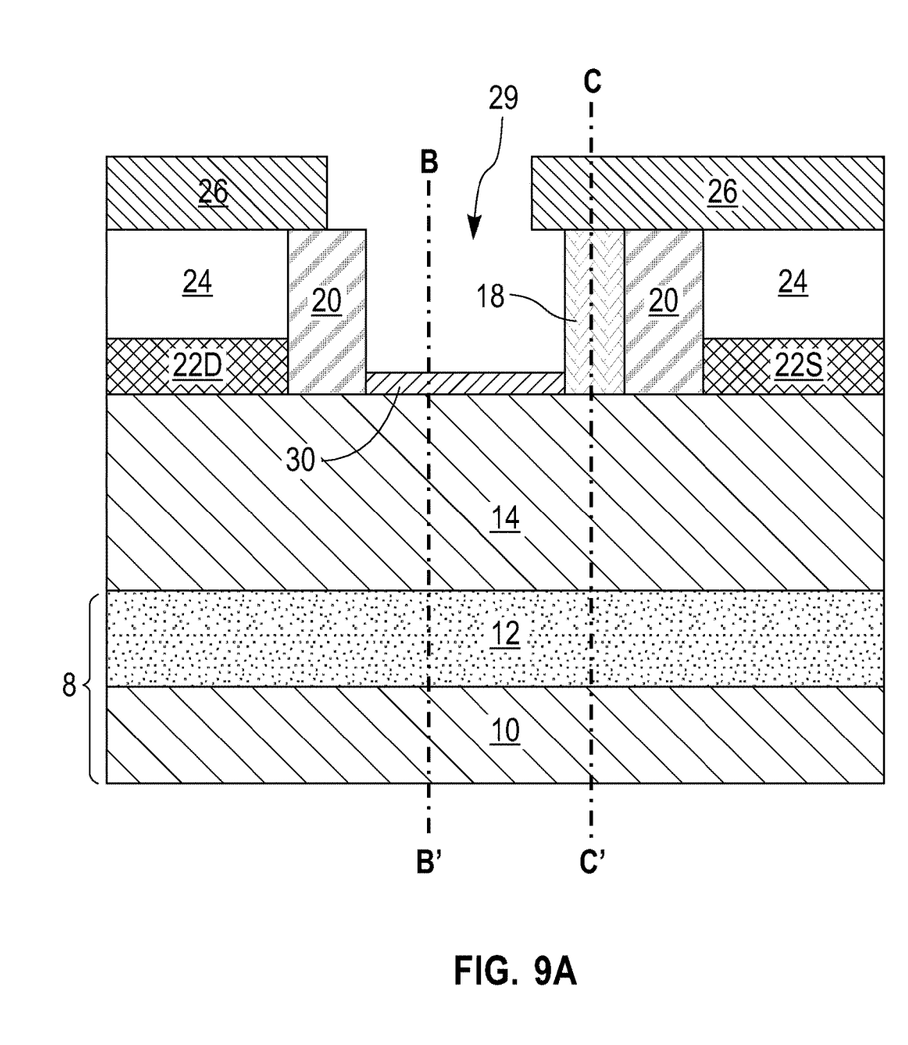
FIG. 9A is a cross sectional view of the semiconductor structure of FIGS. 7A, 7B and 7C after forming an epitaxial semiconductor material layer on the physically exposed portion of the semiconductor fin that is nearest to the drain side.
Figure 9B:
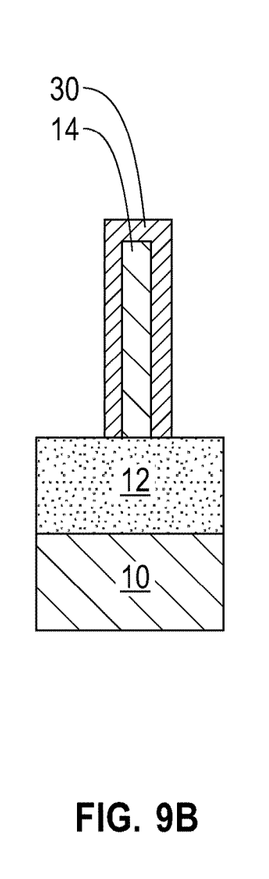
FIG. 9B is a cross sectional view of the exemplary semiconductor structure of FIG. 9A through line B-B'.
Figure 9C:
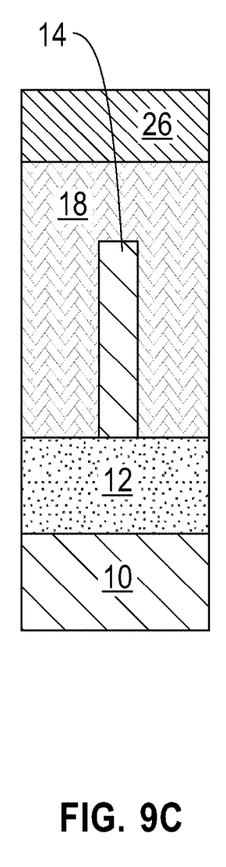
FIG. 9C is a cross sectional view of the exemplary semiconductor structure of FIG. 9A through line C-C'.

Referring now to FIGS. 9A, 9B and 9C, there are shown the semiconductor structure of FIGS. 7A, 7B and 7C after forming an epitaxial semiconductor material layer 30 around the physically exposed portion of the semiconductor fin 14 nearest to the drain side 100. In some embodiments (not shown), the epitaxial semiconductor material layer 30 is formed around the trimmed semiconductor fin portion 14' nearest to the drain side 100. The epitaxial semiconductor material layer 30 is employed in the present application to lower a threshold voltage of the subsequently formed function gate structure.

In one embodiment, and when the semiconductor fin 14 is composed of silicon, and a pFET is to be subsequently formed, the epitaxial semiconductor material layer 30 is composed of a silicon germanium alloy. In another embodiment, and when the semiconductor fin is composed of silicon, and an nFET is to be subsequently formed, the epitaxial semiconductor material layer 30 is composed of carbon doped silicon (Si:C).

The epitaxial semiconductor material layer 30 is formed utilizing an epitaxial growth process, as defined above. The epitaxial semiconductor material layer 30 may have a thickness from 2 nm to 4 nm; although other thicknesses are possible and can be used as the thickness of the epitaxial semiconductor material layer 30.

Figure 10A:
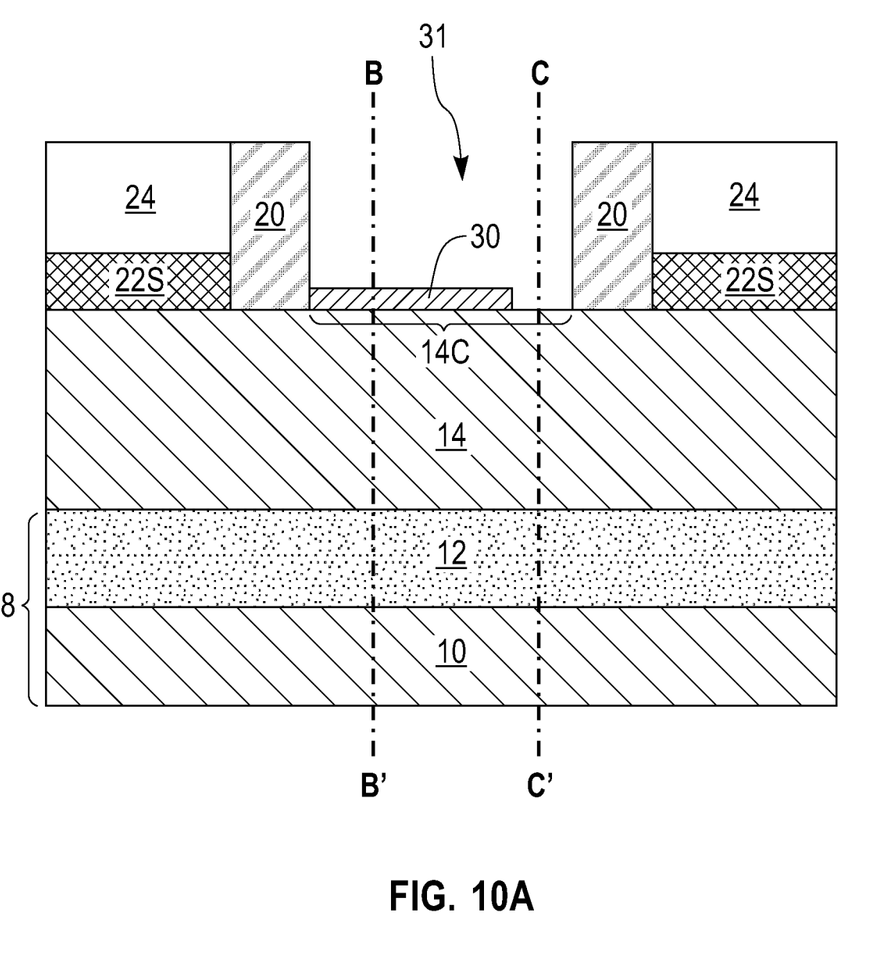
FIG. 10A is a cross sectional view of the semiconductor structure of FIGS. 9A, 9B and 9C after removing the mask, and the first spacer that is present on the source side.
Figure 10B:
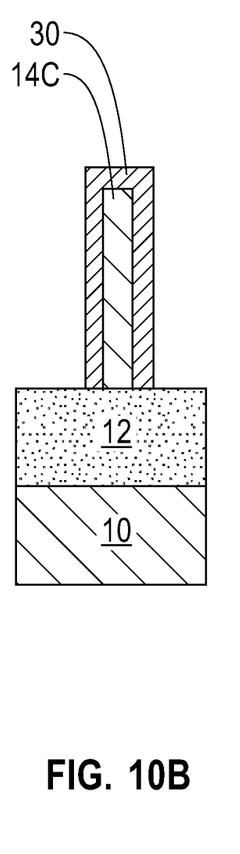
FIG. 10B is a cross sectional view of the exemplary semiconductor structure of FIG. 10A through line B-B'.
Figure 10C:
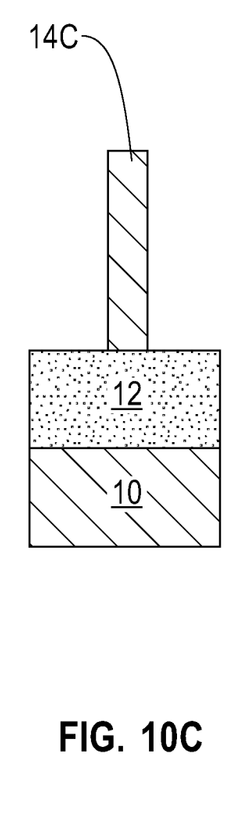
FIG. 10C is a cross sectional view of the exemplary semiconductor structure of FIG. 10A through line C-C'.

Referring now to FIGS. 10A, 10B and 10C, there is illustrated the semiconductor structure of FIGS. 9A, 9B and 9C after removing the mask 26, and the first spacer 18 that is present nearest to the source side 102. A portion of the semiconductor fin 14 nearest to the source side 102 is now physically exposed. Collectively, the physically exposed portion of the semiconductor fin 14 nearest to the source side 102 together with the previously formed physically exposed portion of the semiconductor fin 14 nearest to the drain side 100 form a channel region 14C of the semiconductor fin 14.

Mask 26 may be removed utilizing any material removal process such as, for example, CMP or etching. After removing the mask 26, the first spacer 18 that is present nearest to the source side 102 of the structure is now physically exposed and it may be removed utilizing an etching process that is selective in removing the first spacer 18. Gate cavity 31 is formed as is shown in FIG. 10A. The gate cavity 31 is located between the second spacers 20.

Figure 11A:
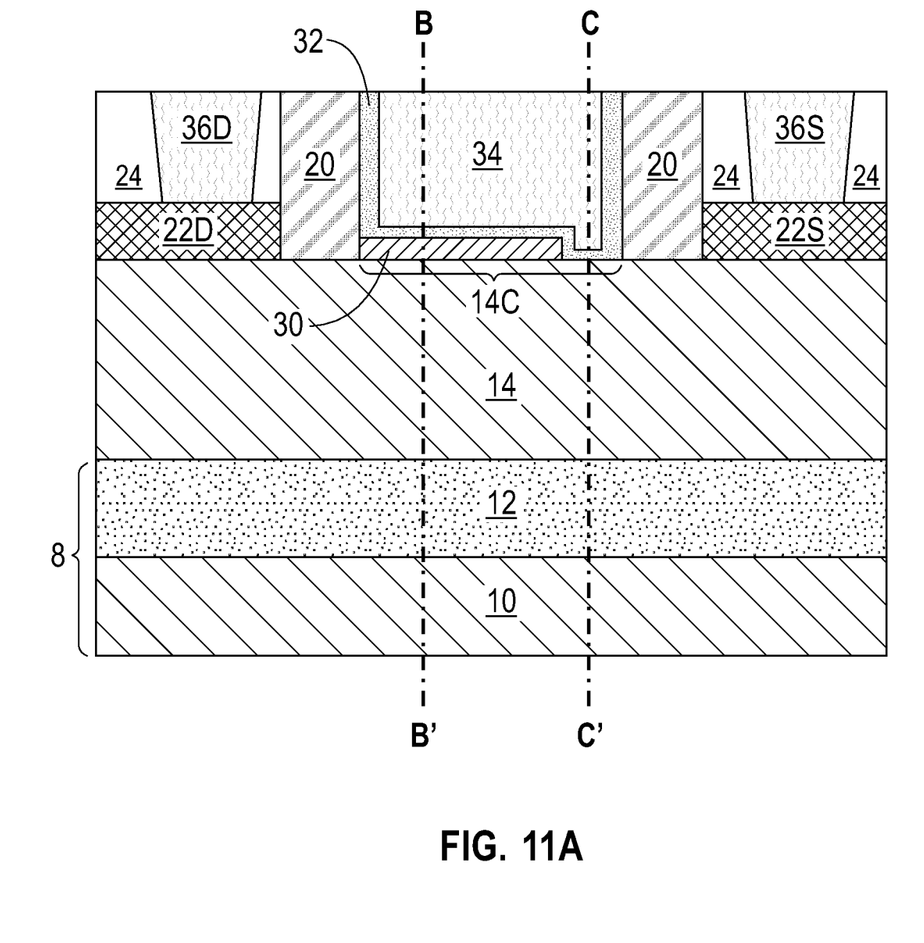
FIG. 11A is a cross sectional view of the exemplary semiconductor structure of FIGS. 10A, 10B and 10C after forming a functional gate structure.
Figure 11B:
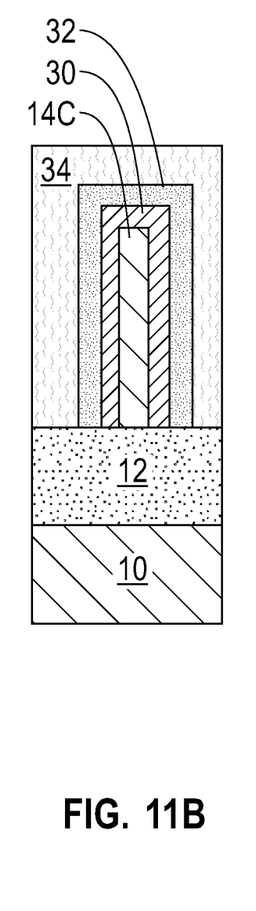
FIG. 11B is a cross sectional view of the exemplary semiconductor structure of FIG. 10A through line B-B'.
Figure 11C:
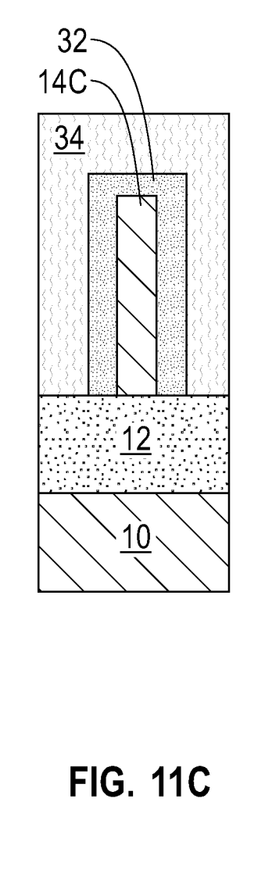
FIG. 11C is a cross sectional view of the exemplary semiconductor structure of FIG. 9A through line C-C'.

Referring now to FIGS. 11A, 11B and 11C, there are shown the exemplary semiconductor structure of FIGS. 10A, 10B and 10C after forming a functional gate structure (32, 34) in the gate cavity 31. By "functional gate structure" it is meant a permanent gate structure used to control output current (i.e., flow of carriers in the channel) of a semiconducting device through electrical or magnetic fields. The functional gate structure (32, 34) has a source side 100 including source structure 22S, and a drain side 102 including drain structure 22D.

The functional gate structure (32, 34) straddles over a channel region 14C of the semiconductor fin 14 as a well as the epitaxial semiconductor material layer 30 that is located on the drain side 100 of the structure. The term "straddles over" denotes that a first material contains a first region present on a first side of a second material, and a second region that is present on a second side of the second material, wherein the two regions of the first material are interconnected by a third region of the first material that extends above a topmost surface of the second material.

The functional gate structure (32, 34) may include a gate dielectric portion 32 and a gate conductor portion 34. The gate dielectric portion 32 may include a gate dielectric material. The gate dielectric material that provides the gate dielectric portion 32 can be an oxide, nitride, and/or oxynitride. In one example, the gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the gate dielectric portion 32.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material that may provide the gate dielectric portion 32.

The gate conductor portion 34 can include a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the gate conductor portion 34 may comprise a pFET gate metal.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 34 can have a thickness from 50 nm to 200 nm. Other thicknesses that are lesser than, or greater than, the aforementioned thickness range can also be employed for the gate conductor material used in providing the gate conductor portion 34.

The functional gate structure (32, 34) can be formed by providing a functional gate material stack of the gate dielectric material, and the gate conductor material. A planarization process may follow the formation of the functional gate material stack. The gate dielectric portion 32 typically has a topmost surface that is coplanar with a topmost surface of the gate conductor 34.

FIG. 11A also shows the structure after forming a drain contact structure 36D contacting a surface of the drain structure 22D and a source contact structure 36S contacting a surface of the source structure 22S. The various contact structures (36D, 36S) can be formed by first providing contact openings (not shown) into the ILD layer 24 to expose the source structure 22S and the drain structure 22DS. The contact openings can be formed by lithography and etching. Each contact opening is then filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The various contact structures (34D, 36SA) are embedded in the ILD layer 24.

Notably, FIGS. 11A, 11B and 11C illustrate a semiconductor structure that has an asymmetrical threshold voltage. The semiconductor structure includes a functional gate structure (32, 34) located on a channel region 14C of a semiconductor fin 14. The structure further includes a source structure 22S located on the semiconductor fin 14 and present in a source side 102 of the functional gate structure (32, 34), and a drain structure 22D located on the semiconductor fin 14 and present in a drain side 100 of the functional gate structure (32, 34). The structure even further includes an epitaxial semiconductor material layer 30 present beneath the functional gate structure (32, 34) and located on a portion of the channel region 14C that is nearest the drain side 100 of the functional gate structure (32, 34). As is shown, the gate dielectric portion 32 of the functional gate structure (32, 34) is in direct physical contact with a portion of the channel region 14C that is nearest to the source side 102, while the gate dielectric portion 32 of the functional gate structure (32, 34) is spaced apart from the channel region 14C that is nearest to the drain side 100 by the epitaxial semiconductor material layer 30.

Notably and due to the presence of the epitaxial semiconductor material layer 30 on the drain side 102 of the structure, the channel region 14C nearest to the drain side 100 of the structure has a lower threshold voltage than the channel region 14C nearest to the source side 102 of the structure. In some embodiments, 25% of a 20 nm channel region 14C has a higher threshold voltage nearest to the source side 102 due to the absence of the epitaxial semiconductor material layer 30 on that side of the structure. It is noted that one can tailor the ratio of high threshold voltage to low threshold voltage in the asymmetric FinFET device by adjusting the width of the first spacer 18.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a functional gate structure located on a channel region of a semiconductor fin;
    a source structure located on the semiconductor fin and present in a source side of the functional gate structure;
    a drain structure located on the semiconductor fin and present in a drain side of the functional gate structure; and
    an epitaxial semiconductor material layer present beneath the functional gate structure and located on a portion of the channel region that is present nearest to the drain side of the functional gate structure.

2. The semiconductor structure of claim 1, wherein the portion of the channel region containing the epitaxial semiconductor material layer has a lower threshold voltage than a remaining portion of the channel region.

3. The semiconductor structure of claim 1, wherein the epitaxial semiconductor material layer is composed of a silicon germanium alloy.

4. The semiconductor structure of claim 1, wherein the epitaxial semiconductor material layer is composed of carbon doped silicon.

5. The semiconductor structure of claim 1, wherein the channel region on the drain side is thinner than the channel region on the source side.

6. The semiconductor structure of claim 1, further comprising a spacer present in the source side and the drain side, wherein the spacer is laterally adjacent, and in contact with, an outermost sidewall surface of the functional gate structure.

7. The semiconductor structure of claim 6, wherein the spacer on the source side separates the source structure from the functional gate structure, and the spacer on the drain side separates the drain structure from the functional gate structure.

8. The semiconductor structure of claim 6, further comprising an interlayer dielectric layer laterally surrounding the spacer present on the source side and the drain side.

9. The semiconductor structure of claim 1, further comprising a source contact structure contacting a surface of the source structure and a drain contact structure contacting a surface of the drain structure.

10. The semiconductor structure of claim 1, wherein the semiconductor fin is located on a surface of an insulator layer of a semiconductor-on-insulator substrate.

11. The semiconductor structure of claim 1, wherein a gate dielectric portion of the functional gate structure is in direct physical contact with a portion of the channel region that is nearest to the source side, while the gate dielectric portion of the functional gate structure is spaced apart from the channel region that is nearest to the drain side by the epitaxial semiconductor material layer.

12. A method of forming a semiconductor structure, the method comprising:
    forming a structure comprising a sacrificial gate structure on a surface of a semiconductor fin, wherein an inner spacer and an outer spacer laterally surround the sacrificial gate structure, and wherein a source structure is present on a source side of the sacrificial gate structure and a drain structure is present on a drain side of the sacrificial gate structure;
    removing the inner spacer that is nearest to the drain side and the sacrificial gate structure to physically expose a portion of the semiconductor fin;
    forming an epitaxial semiconductor material layer on the physically exposed portion of the semiconductor fin;
    removing the inner spacer nearest to the source side to provide a gate cavity located above a channel region of the semiconductor fin and between the outer spacers, wherein the channel region nearest to the drain side contains the epitaxial semiconductor material layer; and
    forming a functional gate structure in the gate cavity and above the channel region of the semiconductor fin.

13. The method of claim 12, wherein the portion of the channel region containing the epitaxial semiconductor material layer has a lower threshold voltage than a remaining portion of the channel region.

14. The method of claim 13, wherein a ratio of low threshold voltage to high threshold voltage is tailored by adjusting the width of the inner spacer.

15. The method of claim 12, wherein the epitaxial semiconductor material layer is composed of a silicon germanium alloy.

16. The method of claim 12, wherein the epitaxial semiconductor material layer is composed of carbon doped silicon.

17. The method of claim 12, further comprising trimming the physically exposed portion of the semiconductor fin prior to the forming of the epitaxial semiconductor material layer.

18. The method of claim 12, wherein the forming of the functional gate structure comprises forming a gate dielectric portion and a forming a gate electrode portion, wherein the gate dielectric portion of the functional gate structure is in direct physical contact with a portion of the channel region that is nearest to the source side, while the gate dielectric portion of the functional gate structure is spaced apart from the channel region that is nearest to the drain side by the epitaxial semiconductor material layer.

19. The method of claim 12, wherein the structure further includes an interlayer dielectric layer located directly on the source structure and the drain structure, and having a topmost surface that is coplanar with a topmost surface of the sacrificial gate structure.

20. The method of claim 19, further comprising forming a source contact structure through the interlayer dielectric layer and contacting a surface of the source structure and a drain contact structure through the interlayer dielectric layer and contacting a surface of the drain structure.

* * * * *